(12) United States Patent
Ferry et al.

(10) Patent No.: US 6,482,263 B1
(45) Date of Patent: Nov. 19, 2002

(54) HEAT SHIELD ASSEMBLY FOR CRYSTAL PULLING APPARATUS

(75) Inventors: Lee W. Ferry; Steven L. Kimbel, both of St. Charles; Kirk D. McCallum, Warrenton; Richard G. Schrenker, Chesterfield, all of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 124 days.

(21) Appl. No.: 09/684,266

(22) Filed: Oct. 6, 2000

(51) Int. Cl.⁷ ............................................. C30B 35/00

(52) U.S. Cl. ...................................... 117/217; 117/900

(58) Field of Search ........................... 117/204, 208, 117/217, 900

(56) References Cited

U.S. PATENT DOCUMENTS

| | | | |
|---|---|---|---|
| 3,291,571 A | | 12/1966 | Dohmen et al. |
| 4,854,959 A | | 8/1989 | Waltert |
| 4,956,153 A | * | 9/1990 | Yamagishi et al. ......... 422/249 |
| 4,981,549 A | | 1/1991 | Yamashita et al. |
| 5,138,179 A | | 8/1992 | Baba et al. |
| 5,183,528 A | | 2/1993 | Baba et al. |
| 5,248,378 A | | 9/1993 | Oda et al. |
| 5,264,189 A | | 11/1993 | Yamashita et al. |
| 5,292,487 A | * | 3/1994 | Tatsumi et al. ............. 422/249 |
| 5,316,742 A | * | 5/1994 | Tomioka et al. ............ 117/217 |
| 5,363,796 A | * | 11/1994 | Kobayashi et al. .......... 117/30 |
| 5,437,242 A | | 8/1995 | Hofstetter et al. |
| 5,441,014 A | * | 8/1995 | Tomioka et al. ............ 117/213 |
| 5,443,034 A | | 8/1995 | Everts |
| 5,476,065 A | * | 12/1995 | Ikezawa et al. ............. 117/217 |

(List continued on next page.)

FOREIGN PATENT DOCUMENTS

| | | |
|---|---|---|
| EP | 0450502 A1 | 10/1991 |
| EP | 0591525 A1 | 4/1994 |
| EP | 0867531 A1 | 9/1998 |
| JP | 04059689 | 6/1990 |
| JP | 03153595 | 7/1991 |
| JP | 03177389 | 8/1991 |
| JP | 7-033587 | 2/1995 |
| JP | 08325090 | 5/1995 |
| JP | 8-091980 | 4/1996 |
| WO | WO 99/16939 | 4/1999 |
| WO | WO 00/50671 | 8/2000 |

OTHER PUBLICATIONS

International Search Report, PCT/US 01/28053 dated Mar. 20, 2002.

*Primary Examiner*—Robert Kunemund
*Assistant Examiner*—Matthew Anderson
(74) *Attorney, Agent, or Firm*—Senniger, Powers, Leavitt & Roedel

(57) ABSTRACT

A heat shield assembly is adapted for location within a crystal puller, with respect to a crucible, above molten source material held by the crucible in the puller. The heat shield assembly has a central opening sized and shaped for surrounding the ingot as the ingot is pulled from the molten material and is generally interposed between the ingot and the crucible as the ingot is pulled from the source material. The heat shield assembly comprises an outer reflector having an inner surface and an outer surface in generally opposed, spaced relationship with a side wall of the crucible, and an inner reflector located inward of the outer reflector. The inner reflector is constructed of a material having a low emissivity and has an outer surface in generally opposed relationship with the inner surface of the outer reflector. At least one of the outer surface of the inner reflector and the inner surface of the outer reflector has a spacer projecting outward therefrom and adapted for contact relationship between the inner reflector and the outer reflector. The spacer spaces the outer surface of the inner reflector from the inner surface of the outer reflector to inhibit heat conduction from the outer reflector to the inner reflector.

13 Claims, 2 Drawing Sheets

U.S. PATENT DOCUMENTS

| | | | |
|---|---|---|---|
| 5,567,399 A | * 10/1996 | Von Ammon et al. | 722/245.1 |
| 5,746,824 A | * 5/1998 | Nemetz | 117/13 |
| 5,824,152 A | 10/1998 | Kubota et al. | |
| 5,900,059 A | 5/1999 | Shimanuki et al. | |
| 5,922,127 A | * 7/1999 | Luter et al. | 117/217 |
| 5,951,753 A | * 9/1999 | Dornberger et al. | 117/3 |
| 6,007,625 A | * 12/1999 | Tomioka et al. | 117/217 |
| 6,036,776 A | * 3/2000 | Kotooka et al. | 117/217 |
| 6,117,402 A | * 9/2000 | Kotooka et al. | 422/245.1 |
| 6,146,459 A | * 11/2000 | Park | 117/217 |
| 6,197,111 B1 | * 3/2001 | Ferry et al. | 117/217 |
| 6,379,460 B1 | * 4/2002 | Harada et al. | 117/217 |

* cited by examiner

HEAT SHIELD ASSEMBLY FOR CRYSTAL PULLING APPARATUS

BACKGROUND OF THE INVENTION

The present invention relates to crystal pulling apparatus for growing single crystal semiconductor material, and more particularly to a heat shield assembly for use in crystal puller apparatus for increasing the axial temperature gradient of single crystal semiconductor material grown in the apparatus.

Single crystal semiconductor material, which is the starting material for fabricating many electronic components, is commonly prepared using the Czochralski ("Cz") method. In this method, polycrystalline semiconductor source material such as polycrystalline silicon ("polysilicon") is melted in a crucible. Then a seed crystal is lowered into the molten material (often referred to as the melt) and slowly raised to grow a single crystal ingot. As the ingot is grown, an upper end cone is formed by decreasing the pull rate and/or the melt temperature, thereby enlarging the ingot diameter, until a target diameter is reached. Once the target diameter is reached, the cylindrical main body of the ingot is formed by controlling the pull rate and the melt temperature to compensate for the decreasing melt level. Near the end of the growth process but before the crucible becomes empty, the ingot diameter is reduced to form a lower end cone which is separated from the melt to produce a finished ingot of semiconductor material.

To increase throughput of the crystal puller, it is desirable to increase the pull rate "v" at which the crystal is pulled up from the melt. However, simply increasing the pull rate, by itself, can be detrimental to the growth and quality of the crystal. For example, an increase in pull rate can result in distortion of the ingot diameter if the ingot is not given sufficient time to cool and solidify as it is pulled up from the melt.

Also, some wafer quality characteristics, such as Gate Oxide Integrity, are effected by a change in pull rate. Silicon wafers sliced from the ingot and manufactured according to conventional processes often include a silicon oxide layer formed on the surface of the wafer. Electronic circuit devices such as MOS devices are fabricated on this silicon oxide layer. Defects in the surface of the wafer, caused by agglomerations present in the growing crystal, lead to poor growth of the oxide layer. The quality of the oxide layer, often referred to as the oxide film dielectric breakdown strength, may be quantitatively measured by fabricating MOS devices on the oxide layer and testing the devices. The Gate Oxide Integrity (GOI) of the crystal is the percentage of operational devices on the oxide layer of the wafers processed from the crystal.

One way to improve GOI is to control the number of vacancies grown into the ingot upon solidification of the ingot as it is pulled up from the melt. It is understood that the type and initial concentration of vacancies and self-interstitials, which become fixed in the ingot as the ingot solidifies, are controlled by the ratio of the growth velocity (i.e., the pull rate v) to the local axial temperature gradient in the ingot at the time of solidification ($G_o$). When the value of this ratio ($v/G_o$) exceeds a critical value, the concentration of vacancies increases. Therefore, to inhibit an increase in the concentration of vacancies, i.e., to avoid increasing the ratio $v/G_o$, the axial temperature gradient at the solid-liquid interface must be correspondingly increased if the pull rate v is to be increased.

To this end, it is known to provide a heat shield assembly disposed above the molten source material and surrounding the ingot as it is pulled upward from the source material to shield the ingot against heat radiated from the crucible and the heater surrounding the crucible. Heat shield assemblies are typically constructed of silicon carbide coated graphite. One disadvantage of these conventional heat shield assemblies is that graphite has a relatively high emissivity, i.e., it has a high ability to emit radiant energy from its surface. As a result, the graphite heat shield radiates a substantial amount of heat toward the ingot, thereby inhibiting cooling of the ingot as it is pulled up from the source material. Consequently, the pull rate at which ingots can be pulled up from the source material in crystal pullers incorporating a heat shield assembly constructed of graphite is limited.

Japanese Patent Application JP 8-325090-A discloses a single crystal drawing apparatus having a heat shield jig comprising a two-layer structure wherein an outer layer constructed of a first material, such as graphite, is coated with an inner layer of a second material, such as quartz, having an emissivity lower than the emissivity of the first material from which the outer layer is constructed. The application also discloses that instead of a quartz covered graphite construction, the two-layer construction could alternatively be constructed of a ceramic outer layer covered by molybdenum. Providing an inner layer of a material having a low emissivity results in decreased heat radiation from the heat shield jig toward the ingot, thereby allowing the ingot to cool more quickly. However, using such a multi-layered structure is inefficient in that the entire outer surface area of the inner layer of the heat shield jig is in thermally conductive contact with the entire inner surface area of the outer layer. Heat is therefore readily conducted from the outer layer to the inner layer of the heat shield jig, thereby reducing the effectiveness of the inner layer.

SUMMARY OF THE INVENTION

Among the several objects and features of the present invention may be noted the provision of a crystal puller which facilitates the growth of silicon crystals at elevated pull rates; and the provision of such a crystal puller which increases the axial temperature gradient of the crystal at the liquid-solid interface; the provision of a heat shield assembly for use in a crystal puller to increase the axial temperature gradient of the crystal at the liquid-solid interface; the provision of an inner reflector for a heat shield assembly of a crystal puller to increase the axial temperature gradient of the crystal at the liquid-solid interface; the provision of such an inner reflector that can be installed in and removed from the crystal puller independently from the remainder of the heat shield assembly; and the provision of such an inner reflector that can be used with existing heat shield assemblies of currently used crystal pullers.

In general, a reflector of the present invention for use in a heat shield assembly of a crystal puller for producing a monocrystalline ingot comprises a tubular structure adapted for positioning generally within the heat shield assembly and having a central opening sized and shaped for surrounding the ingot as the ingot is produced by the crystal puller. An outer surface of the tubular structure is adapted for placement in opposed relationship with the heat shield assembly. The tubular structure is constructed of a material having a low emissivity. The outer surface of the tubular structure has a spacer projecting outward therefrom for contacting the heat shield assembly to space the outer surface of the tubular structure from the heat shield assembly.

In another embodiment, a heat shield assembly of the present invention for use in a crystal puller for producing a monocrystalline ingot comprises an outer reflector having an inner surface and an outer surface. An inner reflector is adapted for positioning generally within the outer reflector in radially spaced relationship therewith. The inner reflector is constructed of a material having a low emissivity and has an outer surface in generally opposed relationship with the inner surface of the outer reflector. At least one of the outer surface of the inner reflector and the inner surface of the outer reflector has a spacer projecting outward therefrom and adapted for contact relationship between the inner reflector and the outer reflector. The spacer spaces the outer surface of the inner reflector from the inner surface of the outer reflector to inhibit heat conduction from the outer reflector to the inner reflector.

In yet another embodiment, a crystal puller of the present invention for producing a monocrystalline ingot comprises a crucible for holding molten semiconductor source material and a heater in thermal communication with the crucible for heating the crucible to a temperature sufficient to melt the semiconductor source material held by the crucible. A pulling mechanism is positioned above the crucible for pulling the ingot from the molten material held by the crucible. The heat shield assembly described above is adapted for location with respect to the crucible above the molten source material. The heat shield assembly has a central opening sized and shaped for surrounding the ingot as the ingot is pulled from the molten material and is generally interposed between the ingot and the crucible as the ingot is pulled from the source material.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE DRAWINGS

Figure 1:
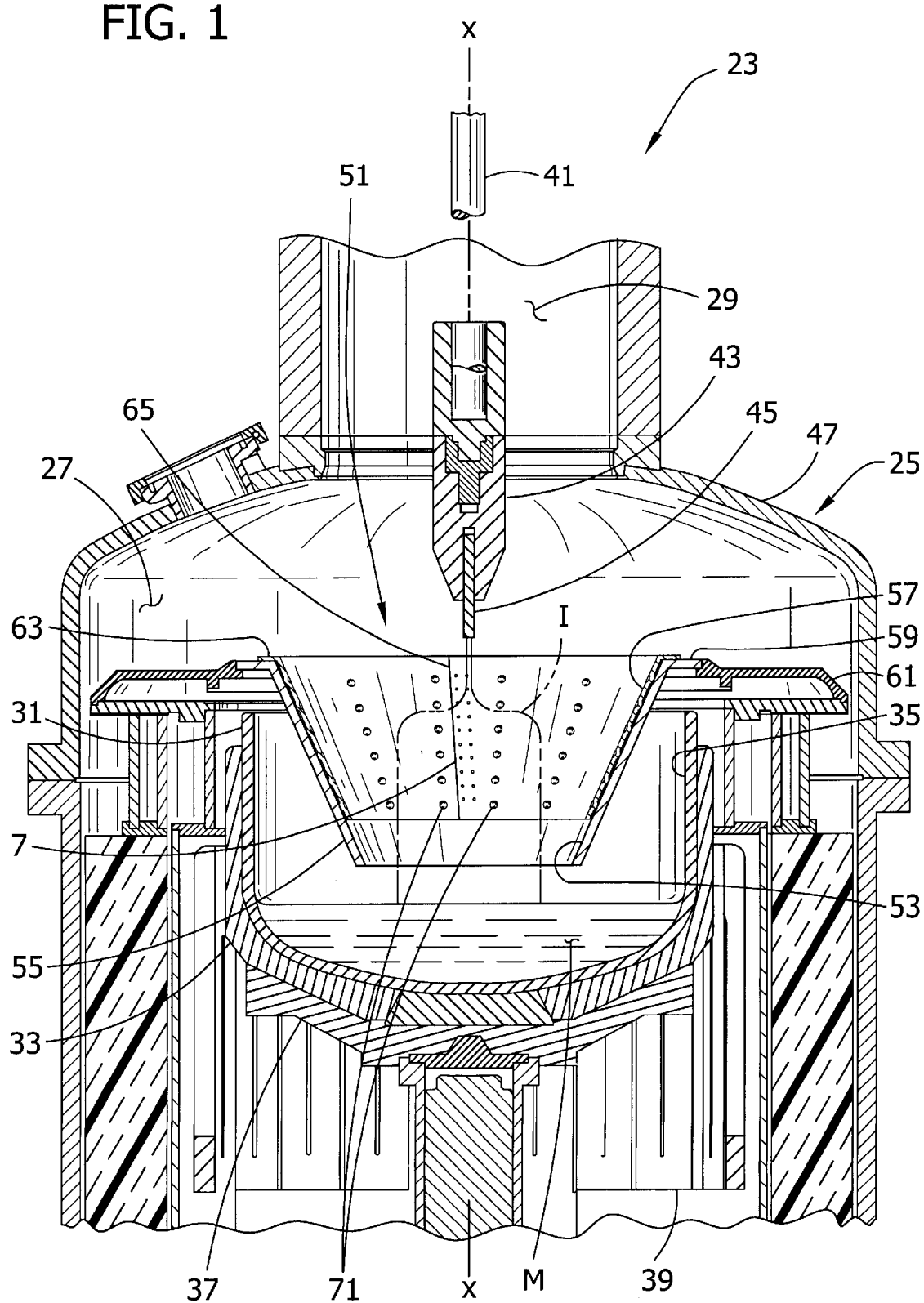
FIG. 1 is a schematic, fragmentary vertical cross-section of a crystal puller of the present invention, including a heat shield assembly of the present invention.

Referring now to the drawings and in particular to FIG. 1, a crystal puller of the present invention of the type used to grow moncrystalline silicon ingots (e.g., ingot I of FIG. 1) according to the Czochralski method is generally indicated at 23. The crystal puller 23 includes a water cooled housing, generally indicated at 25, for isolating an interior which includes a lower crystal growth chamber 27 and an upper pull chamber 29. The pull chamber 29 has a smaller transverse dimension than the growth chamber 27. A quartz crucible 31 seated in a susceptor 33 has a cylincrical side wall 35 and contains molten semiconductor source material M from which the monocrystalline silicon ingot I is grown. The susceptor 35 is mounted on a turntable 37 for rotation of the susceptor and crucible 31 about a central axis X. The crucible 31 is also capable of being raised within the growth chamber 27 to maintain the surface of the molten source material M at a generally constant level as the ingot I is grown and source material is removed from the melt. A resistance heater 39 surrounds the crucible 31 for heating the crucible to melt the source material M in the crucible. The heater 39 is controlled by an external control system (not shown) so that the temperature of the molten source material M is precisely controlled throughout the pulling process.

A pulling mechanism includes a pull shaft 41 extending down from a mechanism (not shown) capable of raising, lowering and rotating the pull shaft. The crystal puller 23 may have a pull wire rather than a shaft 41, depending upon the type of puller. The pull shaft 41 terminates in a seed crystal chuck 43 which holds a seed crystal 45 used to grow the monocrystalline ingot I. The pull shaft 41 has been partially broken away in FIG. 1 for clarity in illustration of a raised position of the seed chuck 43 and ingot I. The general construction and operation of the crystal puller 23, except to the extent explained more fully below, is well known to those of ordinary skill in the art and will not be further described.

Figure 2:
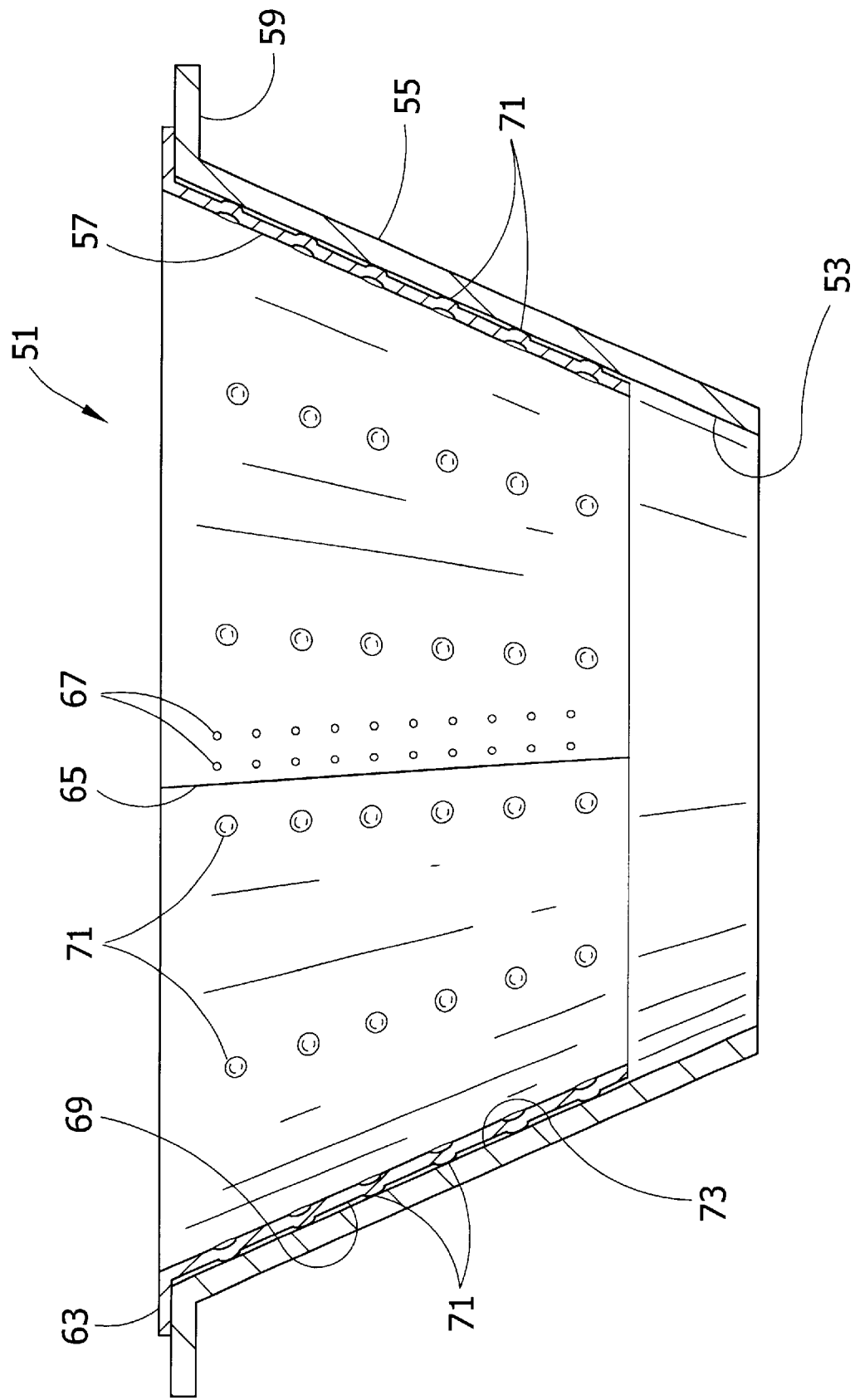
FIG. 2 is a schematic cross-section of the heat shield assembly of FIG. 1.

A heat shield assembly of the present invention for growing silicon crystals at elevated pull rates is generally indicated at 51. The heat shield assembly 51 is mounted in the growth chamber 27 above the molten source material M and has a central opening 53 sized and shaped to surround the ingot I as the ingot is pulled up from the source material. As shown in FIG. 2, the heat shield assembly 51 generally comprises an outer reflector 55 and an inner reflector 57. The outer reflector 55 is generally funnel-shaped and has an annular flange 59 extending radially outward from its upper end. The flange 59 is sized for seating on an annular upper support ring 61 (FIG. 1) disposed in the growth chamber 27 for supporting the outer reflector 55 in the growth chamber. The outer reflector 55 slopes inward and downward from the annular flange 59 and extends down into the crucible 31 to a position above the melt surface so that the outer reflector is at least partially interposed between the crucible side wall 35 and the growing ingot I to inhibit heat radiated from the crucible and resistance heater 39 against radiating to the growing ingot.

The inner reflector 57 is tubular, being generally funnel-shaped and sloping upward and outward from the lower end of the reflector to the upper end. The slope of the inner reflector 57 is substantially the same as the slope of the outer reflector 55. An annular flange 63 extends radially outward from the upper end of the inner reflector 57 for supporting the inner reflector in the crystal puller 23. As shown in FIG. 2, the inner reflector 57 has an axial length substantially less than the axial length of the outer reflector 55 such that the lower end of the inner reflector is positioned above the source material M a distance greater than the lower end of the outer reflector. More preferably, the lower end of the inner reflector 57 is positioned a sufficient distance above the source material M to inhibit splash from the source material against impinging upon the inner reflector. However, an inner reflector 57 having a length substantially the same as, or longer than, the outer reflector 55 is contemplated to be within the scope of this invention.

The inner reflector 57 is constructed of a material having a low emissivity (e.g., a low ability to emit radiant energy from its surface) to inhibit heat radiated by the growing ingot I from being radiated by the inner reflector back to the ingot as the ingot is pulled upward through the heat shield assembly 51. Preferably, the inner reflector 57 is constructed of a refractory metal having a low emissivity. For example, the inner reflector 57 of the illustrated embodiment is constructed of 99.95% pure molybdenum. Molybdenum has an emissivity of approximately 0.2–0.3. As a comparison, graphite, such as that from which the outer reflector 55 is constructed and which is used in the manufacture of conventional heat shield assemblies, has an emissivity of approximately 0.8–0.9. It is understood that the inner reflector 57 may be constructed of other materials having a relatively low emissivity, such as opaque quartz or other suitable materials, without departing from the scope of this invention.

In a preferred method of construction, the inner reflector 57 is constructed from a molybdenum sheet having a thickness in the range of about 0.01–0.015 inches. The reflector 57 is cut from a flat pattern and then formed into a tubular, generally funnel-shaped structure. As seen in FIG. 2, the free ends of the flat pattern are overlapped and secured together along a seam line 65, such as by stitching the ends together with molybdenum wire 67 having a diameter of about 0.025 inches. It is contemplated that methods other than stitching may be used to secure the free ends of the flat pattern together, such as riveting, crimping or other suitable methods, without departing from the scope of this invention. However, stitching using the molybdenum wire 67 has been found to induce only minimal damage and stress to the molybdenum sheet compared to other securement methods, thereby reducing the risk of cracking of the inner reflector 57 during repeated operations of the crystal puller 23.

After the free ends of the flat pattern are secured together to form the tubular structure, slits (not shown) are cut downward from the upper end of the structure to define a plurality of tabs intermediate the slits. The tabs are folded or otherwise bent outward to a generally horizontal orientation to define the annular flange 63 at the upper end of the inner reflector 57. The annular flange 63 is sized radially to seat on at least a portion of the annular flange 59 of the outer reflector 55 such that the outer reflector supports the inner reflector 57 in the crystal puller 23. Supporting the inner reflector 57 in the crystal puller in this manner, free from any connection with the outer reflector 55, allows for easy installation in and removal from the crystal puller 23 separate from the outer reflector. This allows the inner reflector 57 of the present invention to be readily incorporated in existing crystal pullers. Seating the annular flange 63 of the inner reflector 57 over the outer reflector 55 also inhibits the inner reflector against slipping down into the graphite outer reflector as the crystal puller 23 is heated during operation. For example, while molybdenum and graphite have relatively similar expansion properties, the graphite outer reflector 55 is closer to the heater 39 and crucible 31 and is therefore hotter than the molybdenum inner reflector 57 during operation of the crystal puller 23. The graphite outer reflector 55 may thus expand more than the molybdenum inner reflector 57. Without the annular flange 63 at the upper end of the inner reflector 57, the inner reflector could slip down further into outer reflector 55, thereby increasing the risk of damage to the inner reflector upon subsequent cooling (and hence contraction) of the outer reflector.

As shown in FIG. 2, an outer surface 69 of the inner reflector 57 has outward extending prominences 71, or bumps (collectively, a spacer), adapted for contacting an inner surface 73 of the outer reflector 55 upon installation of the inner reflector in the crystal puller 23. The prominences 71 extend normally outward relative to the sloped outer surface 69 of the inner reflector 57. However, it is contemplated that the prominences 71 may extend outward of the outer surface 63 of the inner reflector 57 at an orientation other than normal, such as radially, without departing from the scope of this invention. The prominences 71 are formed by denting or otherwise dimpling an inner surface 75 of the inner reflector 57, such as by using a small round punch, to form the raised prominences in the outer surface 69 of the reflector. As an example, the prominences 71 of the illustrated embodiment are rounded and are approximately 2.5 mm deep and have a diameter of approximately 5 mm.

The prominences 71 are spaced circumferentially about the inner reflector 57 so that when the prominences contact the outer reflector 55 upon installation of the inner reflector in the crystal puller 23, the prominences maintain the outer surface 69 of the inner reflector in spaced relationship with the inner surface 73 of the outer reflector about the circumference of the inner reflector. The prominences 71 are also spaced generally vertically along the outer surface 69 of the inner reflector 57 to minimize surface area contact between the outer surface of the inner reflector and the inner surface 73 of the outer reflector 55 along the height of the inner reflector. It is understood that the shape, number and size of the outward extending prominences 71 may vary and remain within the scope of this invention. For example, where a larger number of prominences 71 are used, the prominences may have a smaller depth. It is also understood that the spacer may comprise a single prominence, such as a collar (not shown) extending circumferentially about the outer surface 69 of the inner reflector 57, without departing from the scope of this invention.

In a preferred method of installing the heat shield assembly 51 in the crystal puller 23, a transition portion 47 of the crystal puller housing 25 is removed to provide access to the interior of the housing. External of the housing 25, the inner reflector 57 is lowered into the outer reflector 55 until the annular flange 63 at the upper end of the inner reflector seats on the annular flange 59 of the outer reflector. Upon insertion of the inner reflector 57 within the outer reflector 55, the prominences 71 extending outward from the outer surface 69 of the inner reflector contact the inner surface 73 of the outer reflector. The prominences 71 help center the inner reflector 57 within the outer reflector 55, with the outer surface 69 of the inner reflector in spaced relationship with the inner surface 73 of the outer reflector. It is understood that, due to manufacturing tolerances and other parameters, some of the prominences 71 may not contact the inner surface 73 of the outer reflector 55, and remain within the scope of this invention. The outer reflector 55, with the inner reflector 57 retained therein, is placed in the housing 25 with the annular flange 59 extending radially outward from the upper end of the outer reflector seating on the annular upper support ring 61 disposed in the growth chamber 27. Alternatively, the outer reflector 55 may be placed in the housing 25 without the inner reflector 57 retained therein, and then the inner reflector would be lowered into the outer reflector within the housing, without departing from the scope of this invention.

In operation, polycrystalline silicon is deposited in the crucible 31 and melted by heat radiated from the resistance heater 39. A seed crystal 45 is brought into contact with the molten silicon source material M and a single crystal ingot I is grown by slow extraction via the pull shaft 41 of the pulling mechanism. As the growing ingot I is pulled upward within the growth chamber 27, the crucible side wall 35 is heated by the resistance heater 39 and by the molten source material M in the crucible 31. Heat from the crucible side wall 35 is transferred to the outer reflector 55. As the ingot I is pulled upward into radial registry with the inner reflector 57, heat radiated from the growing ingot I is either absorbed by inner reflector or reflected by the inner reflector upward within the growth chamber 27 toward the water-cooled housing 25 of the crystal puller 23. Because of the low emissivity of the molybdenum inner reflector, a low amount of heat is radiated by the inner reflector back toward the ingot. The outer reflector 55 shields the ingot I against heat radiated from the crucible 31 and the heater 39 surrounding the crucible from radiating to the growing ingot I.

The inner reflector 57 of the heat shield assembly 51 is shown and described herein as being used in combination with an outer reflector 55 constructed of a single layer structure of silicon carbide coated graphite. However, it is understood that the inner reflector 57 may be configured for use with various other outer reflector designs, such as multiple layer structures, including multiple layer structures having insulation material disposed between two layers of graphite, without departing from the scope of the present invention. It is also understood that the inner reflector 57 may be other than funnel-shaped, such as parabolic or bowl-shaped, for use with known shapes of other outer reflectors (not shown).

Also, while the heat shield assembly 51 is shown and described as comprising an outer reflector 55 and an inner reflector 57 having outward extending prominences 71 adapted for contact with the outer reflector, the prominences may instead extend outward from the inner surface 73 of the outer reflector for contact with the outer surface 69 of the inner reflector and remain within the scope of this invention.

In view of the above, it will be seen that the several objects of the invention are achieved and other advantageous results attained. A heat shield assembly 51 with an inner reflector 57 constructed of a material having a low emissivity either absorbs or reflects heat radiated by the growing ingot I and reduces the amount of heat radiated by the heat shield assembly back toward the growing ingot. Heat reflected by the inner reflector 57 is generally reflected upward within the growth chamber 27 toward the water-cooled housing 25 of the crystal puller 23. Also, providing a spacer (e.g., prominences 71) extending outward from the outer surface 69 of the inner reflector 57 provides minimal surface area contact between the inner reflector and the outer reflector 55. If the inner reflector 57 were in full surface area contact with the graphite outer reflector 55, heat from the outer reflector would be readily conducted to the inner reflector, thereby increasing the temperature of the molybdenum inner reflector such that the reflector radiates more heat toward the ingot. By limiting the amount of surface area contact between the inner and outer reflectors 57, 55, radiation becomes the dominant form of heat transfer from the outer reflector to the inner reflector. Since heat conduction is known to result in a more efficient transfer of heat than radiation, less heat is transferred from the outer reflector 55 to the inner reflector 57.

As a result, the molybdenum inner reflector 57 maintains a cooler temperature during growth of the ingot I. The growing ingot I therefore cools more rapidly as it is pulled up from the molten source material M, thereby increasing the axial temperature gradient of the ingot at the melt surface of the molten source material (i.e., the ingot solidifies faster). Consequently, the pull rate at which the ingot I is pulled up from the source material M may be increased, thereby increasing throughput of the crystal puller 23. For example, pull rates in crystal pullers having a conventional graphite heat shield assembly can approach 0.8 mm/min by optimizing various control parameters. Using the heat shield assembly 51 of the present invention having an inner reflector 57 constructed of a material having a low emissivity, crystal ingots I can be pulled at rates of approximately 1 mm/min, which is a 25% increase.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A crystal puller for producing a monocrystalline ingot, the crystal puller comprising:

a crucible for holding molten semiconductor source material;

a heater in thermal communication with the crucible for heating the crucible to a temperature sufficient to melt the semiconductor source material held by the crucible;

a pulling mechanism positioned above the crucible for pulling the ingot from the molten material held by the crucible; and a heat shield assembly adapted for location with respect to the crucible above the molten source material, the heat shield assembly having a central opening sized and shaped for surrounding the ingot as the ingot is pulled from the molten material, said heat shield assembly being generally interposed between the ingot and the crucible as the ingot is pulled from the source material, said heat shield assembly comprising an outer reflector having an inner surface and an outer surface in generally opposed, spaced relationship with a side wall of the crucible, and an inner reflector located inward of the outer reflector, the inner reflector being constructed of a material having a low emissivity and having an outer surface in generally opposed relationship with the inner surface of the outer reflector, at least one of the outer surface of the inner reflector and the inner surface of the outer reflector having a spacer projecting outward therefrom and adapted for contact relationship between the inner reflector and the outer reflector, the spacer spacing the outer surface of the inner reflector from the inner surface of the outer reflector to inhibit heat conduction from the outer reflector to the inner reflector.

2. A crystal puller as set forth in claim 1 wherein the spacer projects outward from the outer surface of the inner reflector for contacting the inner surface of the outer reflector to space the outer surface of the inner reflector from the inner surface of the outer reflector.

3. A crystal puller as set forth in claim 1 wherein the spacer comprises a plurality of prominences projecting outward from the at least one of said outer surface of the inner reflector and said inner surface of the outer reflector in spaced relationship with each other generally about the circumference of the at least one of said outer surface of the inner reflector and said inner surface of the outer reflector.

4. A crystal puller as set forth in claim 3 wherein the prominences extend circumferentially about the outer surface of the inner reflector, said prominences being formed by dimpling the inner surface of the inner reflector.

5. A crystal puller as set forth in claim 1 wherein the spacer projects generally normally outward relative to the at least one of said outer surface of the inner reflector and said inner surface of the outer reflector.

6. A crystal puller as set forth in claim 1 wherein the bottom of the inner reflector is spaced above the source material a distance substantially greater than the bottom of the outer reflector.

7. A crystal puller as set forth in claim 1 wherein the inner and outer reflectors are each generally funnel-shaped.

8. A crystal puller as set forth in claim 1 wherein the inner reflector is movable relative to the outer reflector for installing the inner reflector within and removing the inner reflector from the outer reflector, the inner reflector further comprising an annular flange extending radially outward from an upper end of the inner reflector, the annular flange being sized for seating on the outer reflector to support the inner reflector in the crystal puller.

9. A crystal puller as set forth in claim 1 wherein the inner reflector is constructed of a refractory metal.

10. A crystal puller as set forth in claim 9 wherein the inner reflector is constructed of molybdenum.

11. A crystal puller as set forth in claim 9, wherein the outer reflector is constructed of graphite.

12. A heat shield assembly for use in a crystal puller for producing a monocrystalline ingot, the heat shield assembly comprising:

an outer reflector having an inner surface and an outer surface; and an inner reflector adapted for positioning generally within the outer reflector in radially spaced relationship therewith, the inner reflector being constructed of a material having a low emissivity and having an outer surface in generally opposed relationship with the inner surface of the outer reflector, at least one of the outer surface of the inner reflector and the inner surface of the outer reflector having a spacer projecting outward therefrom and adapted for contact relationship between the inner reflector and the outer reflector, the spacer spacing the outer surface of the inner reflector from the inner surface of the outer reflector to inhibit heat conduction from the outer reflector to the inner reflector.

13. A reflector for use in a heat shield assembly of a crystal puller for producing a monocrystalline ingot, the reflector comprising:

a tubular structure adapted for positioning generally within the heat shield assembly and having a central opening sized and shaped for surrounding the ingot as the ingot is produced by the crystal puller, an outer surface of the tubular structure being adapted for placement in opposed relationship with the heat shield assembly, the tubular structure being constructed of a material having a low emissivity, the outer surface of the tubular structure having a spacer projecting outward therefrom for contacting the heat shield assembly to space the outer surface of the tubular structure from the heat shield assembly.

* * * * *